United States Patent
Park

(10) Patent No.: US 7,803,652 B2
(45) Date of Patent: Sep. 28, 2010

(54) SEMICONDUCTOR DEVICE FOR IMAGE SENSOR

(75) Inventor: Dong-Bin Park, Daejeon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 368 days.

(21) Appl. No.: 11/963,124

(22) Filed: Dec. 21, 2007

(65) Prior Publication Data

US 2008/0211046 A1    Sep. 4, 2008

(30) Foreign Application Priority Data

Dec. 29, 2006    (KR) .................... 10-2006-0137339

(51) Int. Cl.
*H01L 21/00*    (2006.01)

(52) U.S. Cl. .................. 438/69; 438/70; 257/E31.121; 257/E27.134

(58) Field of Classification Search ............... 438/69, 438/70; 257/E31.121, E27.134
See application file for complete search history.

(56) References Cited

U.S. PATENT DOCUMENTS

| 7,193,289 B2 * | 3/2007 | Adkisson et al. ............ 257/431 |
| 7,342,268 B2 * | 3/2008 | Adkisson et al. ............ 257/291 |
| 7,482,646 B2 * | 1/2009 | Gao et al. .................... 257/292 |

* cited by examiner

*Primary Examiner*—Minh-Loan T Tran
(74) *Attorney, Agent, or Firm*—Sherr & Vaughn, PLLC

(57) ABSTRACT

Embodiments relate to a semiconductor device for an image sensor method of fabricating a semiconductor device for an image sensor having a micro lens. According to embodiments, the method may include forming a lower insulating film having cavities on a substrate, forming an upper insulating film having cavities on the lower insulating film, forming a protective insulating film having metal films on the upper insulating film, forming a number of color filters having a specified pattern on the protective insulating film, forming a planarization layer having a specified curvature on the color filters to bury the color filters in the planarization layer, and forming a number of micro lenses on the planarization layer at respective positions corresponding to the color filters.

6 Claims, 4 Drawing Sheets

SEMICONDUCTOR DEVICE FOR IMAGE SENSOR

The present application claims priority under 35 U.S.C. 119 and 35 U.S.C. 365 to Korean Patent Application No. 10-2006-0137339 (filed on Dec. 29, 2006), which is hereby incorporated by reference in its entirety.

BACKGROUND

Some communication equipment is capable of processing only voice signals, while other more complex equipment processes both voice signals and image signals. Recently, more communication equipment is cable of possessing both voice signals and image signals at the same time. Accordingly, a semiconductor device for an image sensor that can process image signals is in increasing demand, and its importance is gradually increasing.

FIGS. 1A to 1E are cross-sectional drawings illustrating a procedure of fabricating a semiconductor device for an image sensor according to the related art.

Referring to FIG. 1A, an insulating material may be deposited on semiconductor substrate 102 and may form lower insulating film 104 on the entire surface of semiconductor substrate 102. A photoelectric element and a logic circuit may be formed in semiconductor substrate 102.

Referring to FIG. 1B, an insulating material may be deposited on lower insulating film 104 to form upper insulating film 106. During the formation of upper insulating film 106, a metal interconnection (not shown) may be formed. That is, after upper insulating film 106 may be formed, via holes or contact holes may be formed. Then, metal may be buried in the formed via holes or contact holes and the metal interconnection may be formed by performing a planarization process such as a CMP process. Accordingly, upper insulating film 106 may be formed to be flat.

Referring to FIG. 1C, a photoresist may be coated on the entire surface of semiconductor substrate 102. Then, an exposure process may be performed using a mask to selectively remove a portion of the photoresist, thereby forming a photoresist pattern.

Further, color filters 108, which may have a specified pattern, may be formed on upper insulating film 106 using the photoresist pattern.

Referring to FIG. 1D, a photoresist may be coated on semiconductor substrate 102, Planarization layer 110 may be formed over color filters 108.

Referring to FIG. 1E, a photoresist may be coated on semiconductor substrate 102. An exposure process may then be performed using a mask to selectively remove a portion of the photoresist, thereby leaving the photoresist only at positions corresponding to color filters 108 formed below the photoresist, i.e., on the portions where color filters 108 may be formed.

Next, a heat treatment process may be performed on the remaining photoresist. Accordingly, through the photoresist flow process, convex micro lenses 112 having a specified radius of curvature may be formed on planarization layer 110.

In the related art semiconductor device for an image sensor formed through the above process, micro lenses 112 that may be used to collect light may be formed on the planar surface of planarization layer 110.

Thus, a light-receiving region may be small. That is, there may be a limited area onto which light may be projected, which may limit a range of real images to be captured.

Color filters 108 may receive light which has passed through micro lenses 112 and may transmit only a specified wavelength of light. Accordingly, photodiodes may convert light which has passed through color filters 108 into signals, and may then output the signals.

However, in the above-described related art technology, all of the projected light may not pass through color filters 108 and the light may leak between color filters 108 as natural light, which may cause noise in the signals.

Further, light having a substantially short wavelength which has passed through color filters 108 may be also incident on another photodiode under the neighboring color filter, which may cause a crosstalk phenomenon. The crosstalk phenomenon may deteriorate the characteristics of the image sensor.

SUMMARY

Embodiments relate to the fabrication of semiconductor devices, and to a method of fabricating a semiconductor device for an image sensor having a micro lens. Embodiments relate to semiconductor devices, and to a semiconductor device for an image sensor having a micro lens.

Embodiments relate to a method of fabricating a semiconductor device for an image sensor that may be capable of expanding a light-receiving region of the micro lens.

Embodiments relate to a method of fabricating a semiconductor device for an image sensor that may be capable of preventing noise from being generated due to light leaking between the color filters.

Embodiments relate to a method of fabricating a semiconductor device for an image sensor that may be capable of preventing prevent a crosstalk phenomenon.

According to embodiments, a method of fabricating a semiconductor device for an image sensor may include forming a lower insulating film having cavities on a substrate, forming an upper insulating film having cavities on the lower insulating film, forming a protective insulating film having metal films on the upper insulating film, forming a number of color filters having a specified pattern on the protective insulating film, forming a planarization layer having a specified curvature on the color filters to bury the color filters in the planarization layer, and forming a number of micro lenses on the planarization layer at respective positions corresponding to the color filters.

According to embodiments, the metal films may be formed in the protective insulating film such that the metal films may be respectively formed below regions between the color filters.

According to embodiments, the metal films may be respectively formed below regions between the color filters, and the cavities of the upper insulating film may be respectively formed in inner portions of the upper insulating film corresponding to positions of the metal films. Further, the cavities of the lower insulating film may be respectively formed in inner portions of the lower insulating film corresponding to positions of the cavities of the upper insulating film.

According to embodiments, the cavities of the lower insulating film and the cavities of the upper insulating film may be formed at boundaries between unit pixels.

According to embodiments, forming a planarization layer may include coating a photoresist having a specified curvature, and blanket etching the coated photoresist.

DRAWINGS

DESCRIPTION

FIGS. 2A to 2E are cross-sectional drawings illustrating a semiconductor device for an image sensor and a procedure of manufacturing a semiconductor device for an image sensor according to embodiments.

Figure 1A:
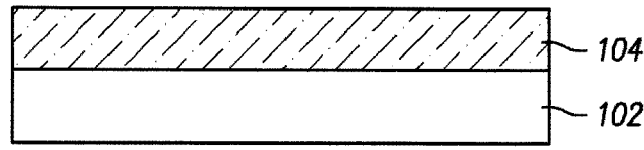
FIGS. 1A to 1E are cross-sectional views showing a procedure of fabricating a semiconductor device for an image sensor according to a related art.
Figure 1B:
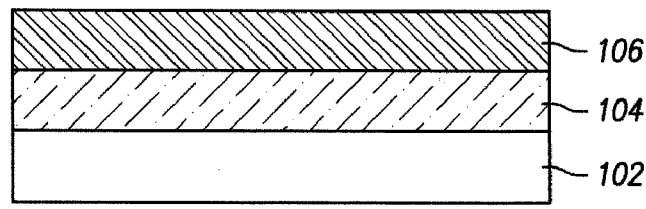
Figure 1C:
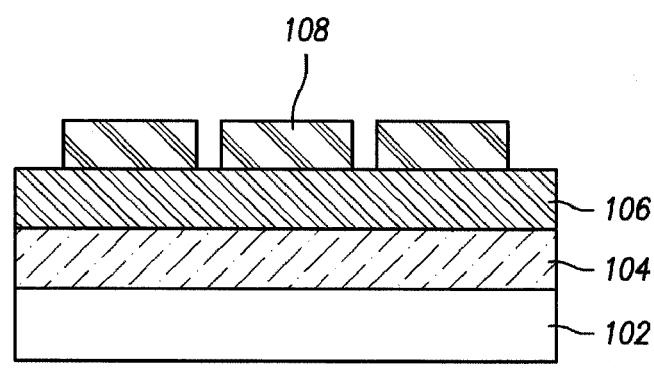
Figure 1D:
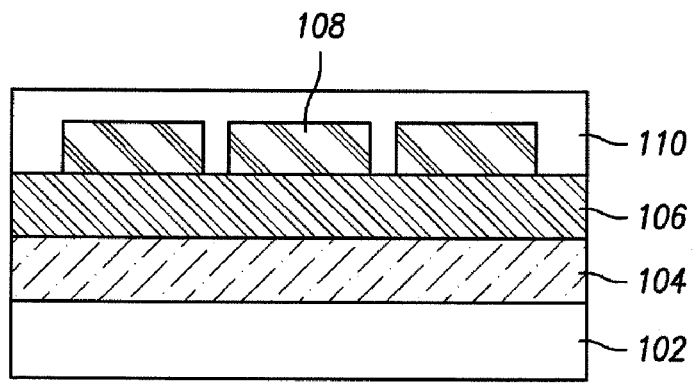
Figure 1E:
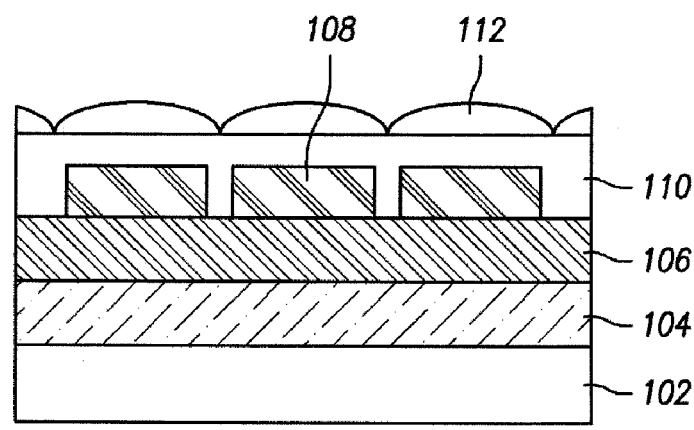
Figure 2A:
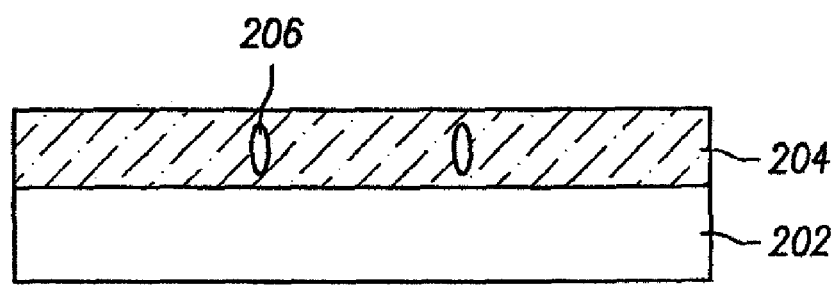
FIGS. 2A to 2E are cross-sectional views showing a semiconductor device for an image sensor and procedure of manufacturing a semiconductor device for an image sensor according to embodiments.

Referring to FIG. 2A, an insulating material may be deposited on semiconductor device 202 and may form lower insulating film 204 on a surface, for example the entire surface, of semiconductor device 202. A photoelectric element and a logic circuit may be formed in semiconductor substrate 102.

Cavities 206 may be formed in lower insulating film 204.

In lower insulating film 204, cavities 206 may be formed at boundaries between unit pixels of the image sensor.

Cavities 206 may be formed as follows.

Reactive ion etching (RIE) may be performed on the boundaries between the unit pixels of lower insulating film 204 and may form a trench.

Then, an oxide film may be coated on lower insulating film 204 including the trench. Accordingly, an upper portion of the trench may be covered with the oxide film and may form cavities 206 serving as empty spaces in lower insulating film 204.

According to embodiments, a trench having a great aspect ratio may be formed on lower insulating film 204. Then, gaseous oxide may be deposited on the trench and oxide may thus be concentrated onto an opening portion of the trench. The oxide film may be therefore be coated on only the opening portion of the trench.

After cavities 206 are formed, a chemical mechanical polishing (CMP) process may be performed and may planarize the surface of lower insulating film 204.

An insulating material may then be deposited on lower insulating film 204 and may form upper insulating film 208.

According to embodiments, while upper insulating film 208 may be formed, a metal bonding pad (not shown) and a metal interconnection (not shown) may be formed. In order to form the metal bonding pad and the metal interconnection, a metal material may be formed on a surface, for example the entire surface of lower insulating film 204. Then, an etching process may be performed using an etching mask and may selectively remove a portion of the metal material. This may selectively expose an upper portion of lower insulating film 204. Accordingly, the metal bonding pad (not shown) and the metal interconnection (not shown) may be formed in a certain pattern on the upper portion of lower insulating film 204.

Figure 2B:
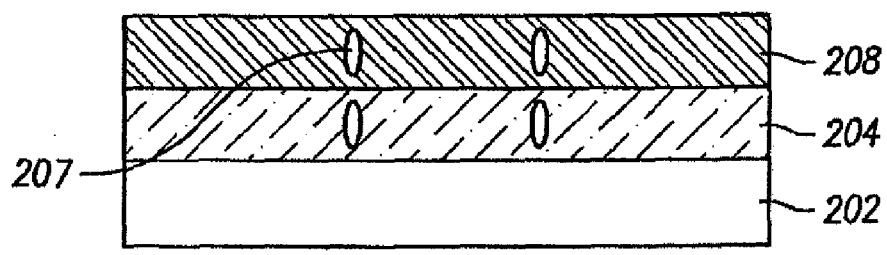

Referring to FIG. 2B, cavities 207 may be formed in upper insulating film 208. According to embodiments, cavities 207 in upper insulating film 208 may be formed at the boundaries between the unit pixels of the image sensor in the same way as cavities 206 in lower insulating film 204. That is, cavities 207 may be formed at the edges of the pixels.

According to embodiments, cavities 207 in the upper insulating film 208 may be formed in the same manner as the above-described manner of forming cavities 206 in lower insulating film 204.

According to embodiments, a deposition process may be performed on a surface, for example the entire surface of the semiconductor substrate 202 with the metal bonding pad, and may planarize the surface of upper insulating film 208 having cavities 207 to be planar.

According to embodiments, cavities 207 in upper insulating film 208 may be formed at the edges of the pixels. Accordingly, a medium may have a smaller refractive index at the edges of the pixels than neighboring portions. According to embodiments, when light reaches cavities 206 after passing through upper insulating film 208 and lower insulating film 204 having a high refractive index, total reflection may occur and may prevent the light from passing into an adjacent photodiode.

Figure 2C:
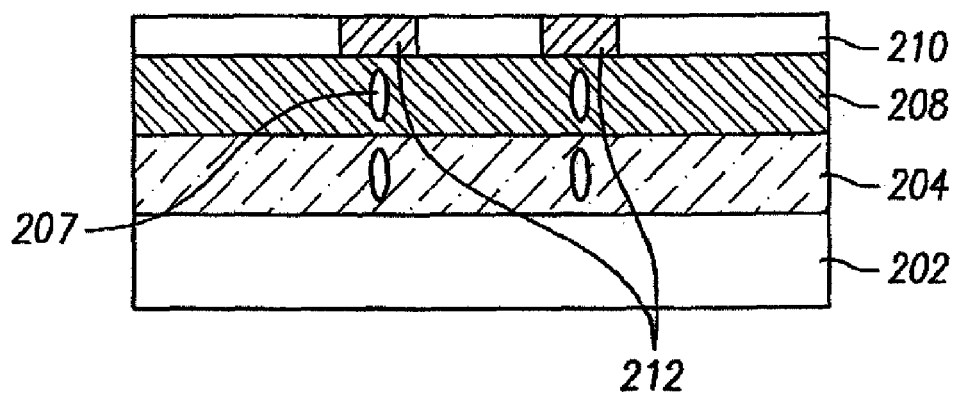

Referring to FIG. 2C, a photoresist may be coated on a surface, for example, the entire surface of semiconductor substrate 202. According to embodiments, an exposure process, a developing process and the like may then be performed and may form an etching mask. An etching process may be performed using the etching mask to selectively remove a portion of upper insulating film 208. An upper portion of the metal bonding pad (not shown) may be exposed by etching upper insulating film 208.

Further, after removing the etching mask used in etching upper insulating film 208, protective insulating film 210 of a thin film may be formed on a surface, for example the entire surface of semiconductor substrate 202.

Then, metal films 212 may be formed in protective insulating film 210 and may prevent light from leaking between the color filters that may be subsequently formed. According to embodiments, metal films 212 may be respectively disposed below regions between the color filters as shown in drawings.

Figure 2D:
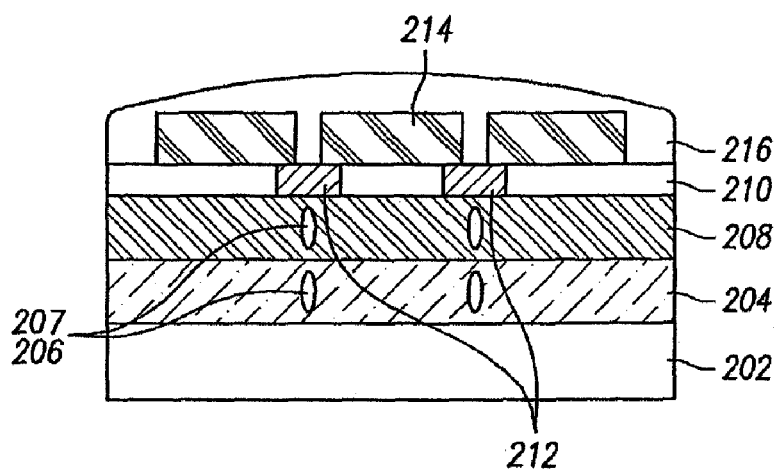

Referring to FIG. 2D, a photoresist may be coated on a surface, for example the entire surface of semiconductor substrate 202. An exposure process may be performed using a mask to selectively remove a portion of the photoresist, and may form a photoresist pattern. Further, color filters 214 having a specified pattern may be formed on protective insulating film 210 using the photoresist pattern.

Planarization layer 216 may then be formed over color filters 214. According to embodiments, planarization layer 216 may have a convex top surface and a specified radius of curvature.

A process of forming planarization layer 216 according to embodiments may be described as follows. First, a photoresist may be deposited and may cover color filters 214. Then, a photoresist having a specified curvature may be coated and may form planarization layer 216, for example by blanket etching.

According to embodiments, color filters 214, metal films 212 formed in protective insulating film 210, cavities 207 formed in the upper insulating film 208 and cavities 206 formed in lower insulating film 204 may be positioned as follows, according to embodiments. That is, metal films 212 in protective insulating film 210 may be respectively formed below the regions between color filters 214. Further, cavities 207 in upper insulating film 208 may be respectively formed at inner portions of upper insulating film 208 corresponding to positions of the metal films 212.

Further, cavities 206 in the lower insulating film 204 may be respectively formed at inner portions of lower insulating film 204 corresponding to the positions of cavities 207 in upper insulating film 208, according to embodiments.

Figure 2E:
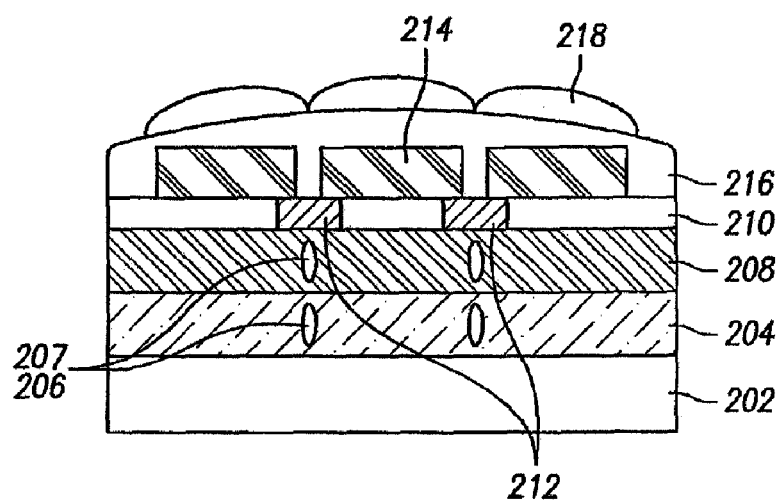

Referring to FIG. 2E, a photoresist for forming micro lenses 218 may be coated on a surface, for example the entire surface of semiconductor substrate 202.

According to embodiments, an exposure process may be performed using a mask to selectively remove a portion of the photoresist. The photoresist may thus remain only at positions corresponding to color filters 214 formed below the photoresist, i.e., on the portions where color filters 214 may have been formed.

According to embodiments, a heat treatment process may be performed on the remaining photoresist.

According to embodiments, through a photoresist flow process, convex micro lenses 218 having a specified radius of curvature may be formed on planarization layer 216.

Micro lenses 218 may be formed on convex planarization layer 216 having a specified curvature, and may thereby expand a region where micro lenses 218 substantially receive light.

According to embodiments, the planarization layer may be formed in a convex curved surface, thereby expanding a light-receiving region of the micro lenses formed on the planarization layer. Thus, it may be possible to improve the performance of the image sensor.

Further, the metal films may be respectively formed below the regions between the color filters, and may prevent light from leaking between the color filters. Thus, it may be possible to prevent the noise from being generated due to leaking light according to embodiments.

Further, a medium has a smaller refractive index at the edges of the pixels than neighboring portions, and may thereby prevent light from being incident on the adjacent photodiode. Accordingly, it may be possible to prevent a crosstalk phenomenon from occurring.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method, comprising:
   forming a lower insulating film having cavities over a substrate;
   forming an upper insulating film having cavities over the lower insulating film;
   forming a protective insulating film having metal films over the upper insulating film;
   forming a plurality of color filters having a prescribed pattern over the protective insulating film;
   forming a planarization layer having a specified curvature over the color filters; and
   forming a plurality of micro lenses over the planarization layer at respective positions corresponding to positions of the color filters.

2. The method of claim 1, wherein the metal films are formed in the protective insulating film such that the metal films are respectively formed below regions between the color filters.

3. The method of claim 1, wherein the metal films are respectively formed below regions between the color filters, and the cavities of the upper insulating film are respectively formed in inner portions of the upper insulating film corresponding to positions of the metal films.

4. The method of claim 3, wherein the cavities of the lower insulating film are respectively formed in inner portions of the lower insulating film corresponding to positions of the cavities of the upper insulating film.

5. The method of claim 1, wherein the cavities of the lower insulating film and the cavities of the upper insulating film are formed at boundaries between unit pixels.

6. The method of claim 1, wherein forming the planarization layer comprises:
   coating a photoresist having a specified curvature; and
   blanket etching the coated photoresist.

* * * * *